United States Patent [19]

Adolfsson et al.

[11] 4,316,141
[45] Feb. 16, 1982

[54] MEASURING DEVICE WITH OPTICAL SIGNAL TRANSMISSION

[75] Inventors: Morgan Adolfsson; Torgny Brogårdh, both of Vesteras, Sweden

[73] Assignee: ASEA Aktiebolag, Vesterås, Sweden

[21] Appl. No.: 87,773

[22] Filed: Oct. 24, 1979

[30] Foreign Application Priority Data

Oct. 27, 1978 [SE] Sweden .................. 7811165

[51] Int. Cl.³ .................. G01R 31/00; H04B 9/00
[52] U.S. Cl. .................. 324/96; 455/612; 455/617
[58] Field of Search .................. 324/96; 455/609, 610, 455/612, 617, 59

[56] References Cited

U.S. PATENT DOCUMENTS

| 3,384,837 | 5/1968 | Toussaint et al. .................. 455/612 |
| 3,666,956 | 5/1972 | von Willisen .................. 250/199 |
| 4,070,572 | 1/1978 | Summerhayes .................. 250/199 |

FOREIGN PATENT DOCUMENTS

| 4815 | 10/1979 | European Pat. Off. . |
| 2700717 | 7/1977 | Fed. Rep. of Germany . |
| 2716788 | 10/1978 | Fed. Rep. of Germany . |
| 2361022 | 3/1978 | France . |

Primary Examiner—Ernest F. Karlsen
Attorney, Agent, or Firm—Watson, Cole, Grindle & Watson

[57] ABSTRACT

The invention relates to a measuring device having a transmitter side and a receiver side, arranged for signal transmission from the transmitter side to the receiver side via an optical connection. The transmitter side comprises members for combining an incoming measuring signal with a signal from a reference voltage source to two different signals, arranged to be transmitted to the receiver side via each of two parallel optical channels. The receiver side comprises means for receiving the two transmitted signals and for controlling the amplification in the signal paths with a view to obtaining compensation for variation of parameters included in the two channels and other elements in corresponding signal paths. In addition, the receiver side includes a device which, from the two transmitted signals, forms a signal ($U_{ut}$) independent of the input measuring signal of the transmitter side.

14 Claims, 4 Drawing Figures

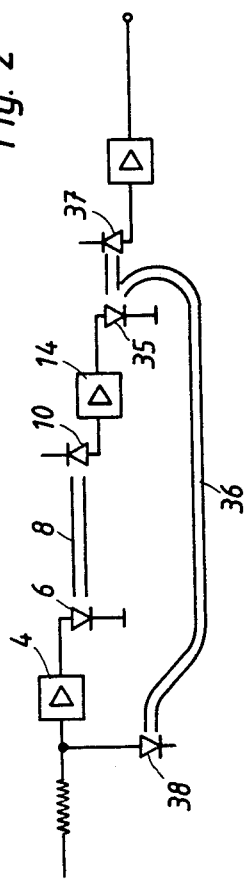
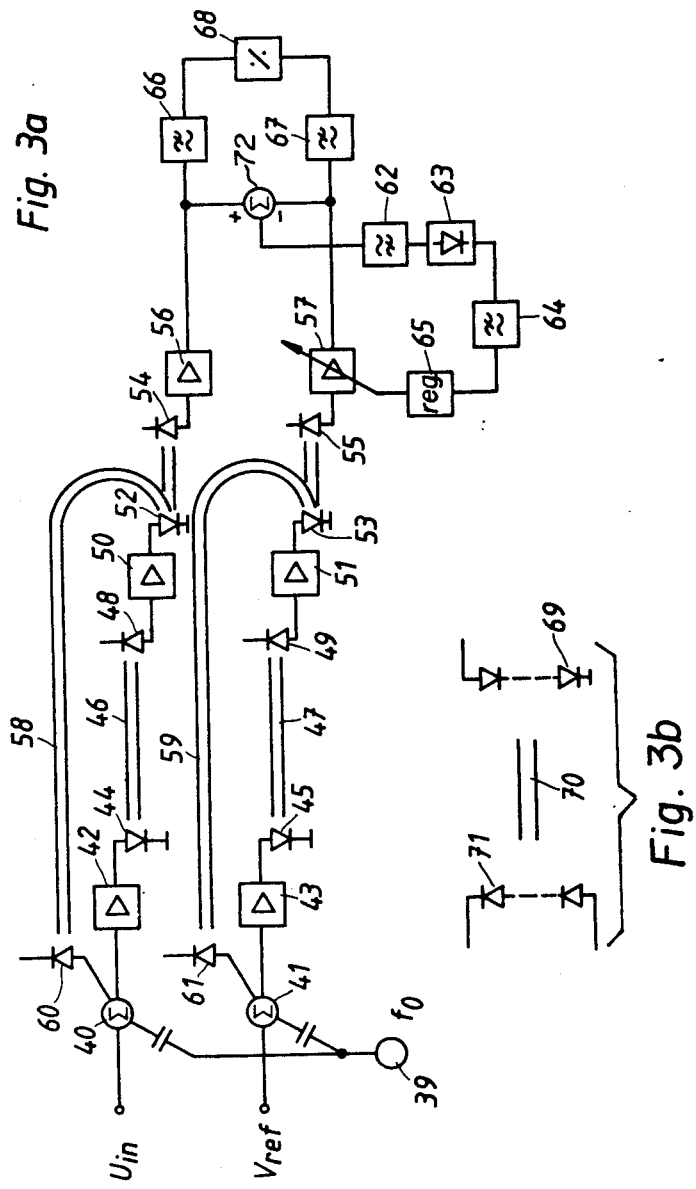

MEASURING DEVICE WITH OPTICAL SIGNAL TRANSMISSION

BACKGROUND OF THE INVENTION

1. Field of the Invention

The present invention relates to a measuring device having a transmitter side and a receiver side, said device being arranged for transmitting signals from the transmitter side to the receiver side via an optical connection.

2. Prior Art

It is known that measuring signals and other light signals can be transmitted via an optical link. Such a link comprises a light transmitter, light-transmitting members and light-detecting members. The light transmitter comprises members for modulation of the emitted light in a suitable manner such that the emitted light contains information about the present value of the measuring signal. The light-transmitting member, which may consist of one or more light conductors (optical fibers), transmits light signals to the detecting member, where information about the measuring signal is transformed into a suitable signal, for example into an electric voltage proportional to the measuring signal. A measuring device of this kind has several advantages. Galvanic separation is automatically obtained between the transmitter side and the receiver side, and therefore these sides may be located at completely different potential levels. The optical line is wholly insensitive to electromagnetic disturbances. In addition, no sparks or short-circuits may occur, which is of value, for example, in an explosive environment.

In a measuring device of the above-mentioned kind it is of considerable importance to reduce the power consumption on the transmitter side as far as possible, since the energy supply to the members of the transmitter side may present a problem, for example in those cases where these members are located at a high potential level.

In measuring at a high potential, it is a desire to dispense with the current and voltage transformers for high voltages which have been commonly used so far, but the transmission of energy from the receiver side to the transmitter side continues to be a problem.

In a measuring device for which a patent application has been filed in the United States by the same inventors (U.S. Ser. No. 75,873, filed Sept. 17, 1979) a measuring signal is transmitted from a transducer over a certain distance and/or a certain potential difference. The measuring device has a transmitter side, arranged in conjunction with the transducer, which is connected to a receiver side by an optical transmission link. The transmission side includes comparing members which compare measuring signals with a feed-back signal transmitted from the receiver side. The comparison result is transmitted to the receiver side, where it controls a regulator, the output signal of which constitutes the feed-back signal as well as the output signal of the measuring device. The measuring device further includes members for automatically maintaining the amplification in the transmission link for the feed-back signal constant. This device is a solution to the above-mentioned problems, and since only minor error signals are transmitted from the transmitter side to the receiver side the dynamic range of such transmission is low. The dynamic range of the total transmission is wholly determined by the dynamic range in the transmission of the feed-back signal from the receiver side to the transmitter side.

SUMMARY OF THE INVENTION

It is an object of the invention to supplement the aforementioned device and still solve the above-mentioned problems for those cases where only a certain limited power is available on the transmitter side. It is another object of the invention to provide a certain dynamic range on the transmitter side.

The present invention provides a solution to the problems mentioned above and is characterised in that the transmitter side comprises members for combining incoming measuring signals ($U_{in}$) with reference signals ($V_{ref}$) into at least two different signals, arranged to be transmitted to the receiver side via at least two parallel optical channels, the receiver side comprising means for receiving the transmitted signals and for forming from these signals an output signal ($U_{ut}$) dependent on the measuring signals ($U_{in}$) of the transmitter side and independent of drift and instability in the optical channels and the associated optoelectronics. In this way a reliable and simple equipment is obtained involving few optical fiber transmissions a simple electronics system.

BRIEF DESCRIPTION OF THE FIGURES

The above objects, features and advantages of the invention are exemplified in the accompanying drawings, wherein.

FIG. 2 shows a modified embodiment of the invention for linearising the transmission involving a lower power consumption on the transmitter side;

FIG. 3a shows an optically coupled, analog measuring device, in which the output signal is obtained through the formation of a quotient; and FIG. 3b shows a power supply for the transmitter of FIG. 3a.

DETAILED DESCRIPTION

Figure 1:
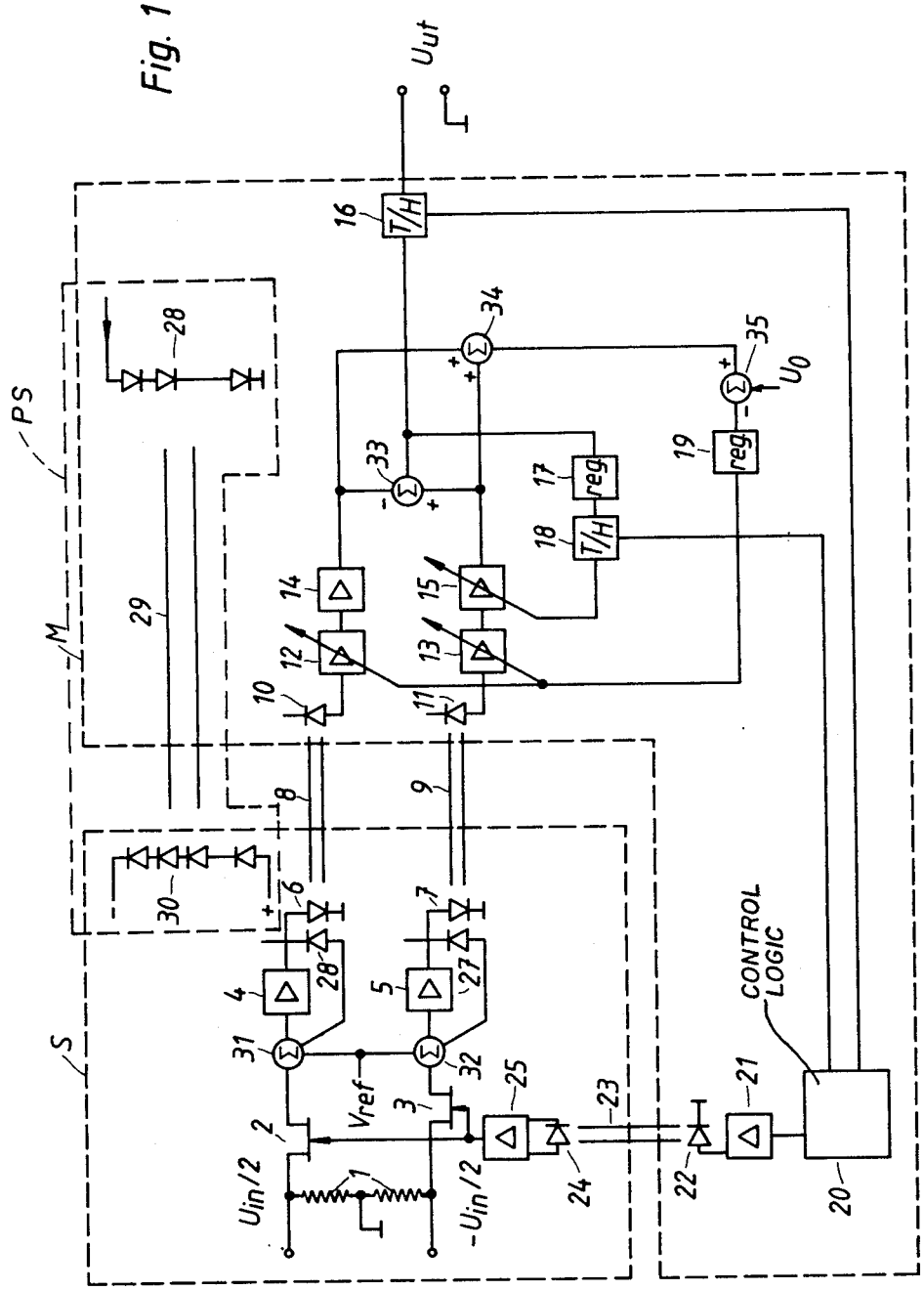
FIG. 1 shows an optically coupled, analog measuring device according to the invention, in which the output signal is formed from the difference between the transmitted optical signals.

FIG. 1 shows an optically coupled measuring device according to the invention for transmitting and transforming an analog electric input signal $U_{in}$ into an analog electric output signal $U_{ut}$. The measuring device consists of a transmitter side S and a receiver side M, which are interconnected by means of at least two light conductors 8, 9. The transmitter and receiver sides may be separated a distance of up to several kilometers, and they may be located at different electric potentials.

Alternatively, for example where only a potential difference, which is not too great, is to be bridged, the transmitter and receiver sides may be connected to each other, in which case the light conductors with associated light-emitting diodes (LEDs) and photodiodes may consist of optic couplers.

FIG. 1 shows an optically coupled, analog measuring amplifier, in which the stabilization of the analog transmission takes place according to the "bridge principle". The measuring signal $U_{in}$ is input symmetrically to the middle node or midpoint of voltage divider 1. The signals $+U_{in}/2$ and $-U_{in}/2$ are then obtained at each respective end node of voltage divider 1. The signal $+U_{in}/2$ passes via an analog contact device, for example field effect transsistor 2, to a summation device 31 where this signal is added to a reference voltage $V_{ref}$ from a constant voltage source, and the composite signal $(+U_{in}/2+V_{ref})$ passes to the input of the amplifier 4. In a corresponding manner, a composite signal $(-U_{in}/2+V_{ref})$ is obtained from the summation device 32 after $-U_{in}/2$ has passed the field effect transistor 3. Summation signal output of summation device 32 is supplied to amplifier 5.

The two signals thus combined, $+U_{in}/2+V_{ref}$ and $-U_{in}/2+V_{ref}$, enter two parallel signal paths, consisting of the following respective components: amplifiers 4 and 5, which are optically linearized by means of feedback photodiodes 27 and 28, light-emitting diodes (LED) 6 and 7, the two optical channels 8 and 9 (light conductor fibers), photodiodes 10 and 11, the controllable photo-amplifiers 12 and 13, and a variable amplifier 15 and an amplifier 14 with fixed amplification. The transmitter feedback circuits, which contain photodiodes 27 and 28, compensate for non-linearities of LEDs 6 and 7. The signal paths (the channels) differ from each other in that the amplifier 14 in the upper channel in FIG. 1 has fixed amplification or gain, whereas the amplification or gain of amplifier 15 in the lower channel is variable. The measurement procedure is divided with respect to time (time multiplexed) into two intervals, one in which the transmission in the two channels is balanced, and one in which the measurement itself is carried out. The signal paths of the measuring signals side in the transmitter portion S are controlled via transistors 23 by means of a control logic system 20 more fully described below.

During the balancing interval the transistors or switches 2 and 3 are open, and therefore the input signals to both channels have the same voltage, namely $V_{ref}$.

The output signals from amplifiers 14 and 15, respectively, are compared in the summation device 33 and any deviation due to parameter variations (aging of the diodes, changed curvature of the light conductors, differences of the variable amplifiers, etc.) gives rise to an error signal, which is supplied to the regulator 17 which controls the amplification in the variable amplifier 15 by way of the sample and hold or track and hold circuit (T/H) 18. The balancing of the two channels causes the total transmission characteristic in the two channels 6-14 and 7-15, respectively, to substantially equal each other despite the variation of the parameters of the opto-components. The sum of the signals from amplifiers 14 and 15 is formed in the summation device 34 and is compared in a difference output former 35 with a constant voltage $U_O$, and the difference is allowed to influence the amplifications in amplifiers 12 and 13 via a regulator 19. This method ensures compensation for the variations which occur in the two channels simultaneously. During the measuring interval, the amplification in amplifier 15 is held constant by the track and hold circuit (T/H) 18 operating in the hold position, and the voltages $V_{ref}+U_{in}/2$ and $V_{ref}-U_{in}/2$, respectively, are connected to the inputs of amplifiers 4 and 5, respectively. This time interval is called a measuring interval as opposed to that described above, which is called a calibrating interval.

During the measuring interval, the output signal is obtained as the difference between the output signals of amplifiers 14 and 15. The T/H circuit 16 makes it possible for the output signal to be held constant during the balancing interval (the calibrating interval). The T/H circuits 16 and 18 are controlled from the control logic system 20, which also operates the analog switches (transistors) 2 and 3 via an amplifier 21, an LED 22, a light conductor fiber 23, and a photo-current amplifier 25.

The power to the transmitter side is transmitted optically by a current passing through the LEDs, or the semiconductor lasers 28, and being transformed into light. The light is transmitted through one or more light conductor fibers 29 to the series-connected photodiodes 30, the output voltage of which constitutes the power supply p.s. for the electronics system.

Upon calibration (2 and 3 opened), the following output signal is obtained from the summation device 33:

$$k_1 \cdot V_{ref} - k_2 \cdot V_{ref} = (k_1 - k_2)V_{ref}$$

$k_1$ and $k_2$ are the total amplification factors in the two channels.

The regulator 17 is adjusted so that $k_1 - k_2 = 0$ and $k_1 = k_2 = k$.

The regulator 19 is adjusted so that:

$$k_1 \cdot V_{ref} + k_2 \cdot V_{ref} = U_O$$
$$(k_1 + k_2) V_{ref} = U_O$$
$$2k \cdot V_{ref} = U_O$$
$$k = \frac{U_O}{2 \cdot V_{ref}}$$

During measuring (2 and 3 closed) the following is obtained:

$$U_{ut} = k_1 \left(V_{ref} - \frac{U_{in}}{2}\right) - k_2 \left(V_{ref} + \frac{U_{in}}{2}\right) =$$
$$k \cdot V_{ref} - k \cdot \frac{U_{in}}{2} - k \cdot V_{ref} - k \cdot \frac{U_{in}}{2} = -k \cdot U_{in}$$
$$U_{ut} = -\frac{U_O}{2 \cdot V_{ref}} U_{in}$$

FIG. 2 shows a device in which the direct feedback of the light from the LED 6 and 7 via a photodiode 27 and 28 respectively is replaced with a fiber optical feedback from LED 35 in case of failing power on the transmitter side S. An additional light fiber 36 is used for the feedback which takes place via the receiver portion where the remaining or other portion of the light from LED 35 is amplified to provide an output signal. This results in a transmitter portion (transducer module) which requires less power.

More specifically, light from the photodiode 6 passes via a light conductor fiber 8 to a photodiode 10 with an amplifier 14, which drives an LED 35. The light from the LED 35 results in an output signal via a photodiode 37 with an associated amplifier 38, as well as in a feedback signal to the amplifier 4 via the light conductor fiber 36 and the photodiode 38.

In FIG. 1 the analog switches 2 and 3 and photodiode 24 and photo-current amplifier 25 may be replaced with photo field effect transistors, which are controlled directly with the light from the light conductor fiber 23.

The measuring device according to FIG. 3 is an optically coupled, analog measuring amplifier, in which the stabilization of the transmission is made according to the bridge principle. The same oscillating signal of frequency $f_O$ from the oscillator 39 via the summation devices 40 and 41 to the inputs of two amplifiers 42 and 43 is added to each of the two signals, the input signal $U_{in}$ and the reference voltage $V_{ref}$. The summed signals are transmitted in two parallel channels, consisting of amplifiers 42 and 43, LEDs 44 and 45, light conductor fibers 46 and 47, photodiodes 48 and 49, photo-current amplifiers 50 and 51, LEDs 52 and 53, photodiodes 54 and 55, and amplifiers 56 and 57 (cf. 14 and 15 in FIG. 1). Both channels are the same, except that amplifier 56 has fixed amplification and amplifier 57 has adjustable gain. To improve the linearity of the transmission, part of the light from LEDs 52 and 53 is conducted through light conductor fibers 58 and 59 and photodiodes 60 and 61 to summation points 40 and 41 at the inputs of amplifiers 42 and 43. The light is transformed in photodiodes 60 and 61 into electric signals and in this way forms linearizing feedback signals. The difference between the output signals from amplifiers 56 and 57 obtained by summation device 72 passes through a high-pass filter 62, where only components of the signal with the frequency $f_O$, or higher, may pass. This signal component is rectified in the rectifier 63, is low-pass filtered in low-pass filter 64 and is supplied to a regulator 65 which adjusts the amplification or gain of the variable amplifier 57. The amplification or gain of amplifier 57 is changed in such a way that deviations in the transmission characteristic between the two channels are compensated. The output signals from the two channels are allowed to pass through low-pass filters 66 and 67, components of the frequency $f_O$ thus being filtered. The quotient between the signals of the outputs to the low-pass filters is obtained by supplying the output signals to a division circuit 68. The resulting quotient is taken as an output signal and in this way compensation is obtained for variations in transmission which occur in both transmission channels. The signal of the frequency $f_O$, which is used for balancing the transmission in the two channels, is formed by an oscillator 39 in the transducer module as shown in FIG. 3b. The supply to the transducer module is transmitted optically by the fact that the light, which is generated by the LEDs, or by the semiconductor lasers 69, is transmitted to one or more optical fibers 70 into series-connected photodiodes 71, which provide supply voltage to the electronics system in the transmitter portion.

The embodiments as described above may be varied in many ways within the scope of the following claims.

We claim:

1. Measuring device for providing output signals representative of input measuring signals, comprising:
    a transmitter for combining input measuring signals with a reference signal and forming at least two different signals therefrom;
    a receiver responsive to said at least two different signals for forming output signals representative of said input measuring signals;
    at least two optical transmission channels for transmitting said at least two different signals from said transmitter to said receiver; and
    said receiver including at least one variable gain amplifier responsive to the transmission output from one of said at least two optical transmission channels, compensation means for generating at least one reference signal from said at least two different signals, and the gain of said variable gain amplifier being controlled by said at least one reference signal such that said output signals are independent of drift and instability in the transmitter, receiver and at least two optical transmission channels.

2. Measuring device according to claim 1 wherein said input measuring signals and said reference signal are electrical signals, and said transmitter includes means for transforming said electrical signals into optical signals.

3. Measuring device according to claim 1 wherein said compensation means includes means for obtaining the difference between said at least two different signals to separate said reference signal from said input measuring signals and generating an error signal therefrom, and control means for varying the variable gain of said variable gain amplifier in accordance with said error signal.

4. Measuring device according to claim 1 further comprising means for time multiplexing said transmitter and receiver to establish repetitive calibration and measuring intervals, said transmitter including switching means responsive to said means for time multiplexing to block input of said input measuring signals during said calibration interval, and said receiver including sampling and hold circuitry responsive to said time multiplexing means to respectively sample and hold said output signals during said calibration and measuring intervals.

5. Measuring device according to claim 4 wherein said transmitter forms two different signals and comprising two optical transmission channels respectively transmitting said two different signals from said transmitter to said receiver, said receiver including means for determining the difference between said at least two different signals to form said output signals, said compensation means including means for generating an error signal during said calibration interval from the difference between said reference signal in each of the transmission paths formed by said transmitter, receiver and each respective optical transmission channel, and said sampling and hold means sampling said error signal to vary the gain of said variable gain amplifier to compensate for different parameter variations in each of said two optical transmission channels, said transmitter and said receiver.

6. Measuring device according to claim 1 wherein said transmitter includes means for forming two different signals by frequency multiplexing said input measuring signals and said reference signal, and comprising two optical transmission channels respectively transmitting one of said two different signals from said transmitter to said receiver, said receiver including means for determining the difference between said at least two different signals to form an error signal and said compensation means including means responsive to said error signal for generating a gain control signal representing the difference between the reference signal components in each of the transmission paths formed by said transmitter, said receiver and each respective optical transmission channel, and said compensation means further including a regulator responsive to said gain control signal for varying the gain of said variable gain amplifier to compensate for different parameter variations in each of said two optical transmission channels, said receiver and said transmitter.

7. Measuring device according to claim 6 wherein said receiver further includes means for forming the quotient from the respective at least two different signals transmitted by said two optical transmission channels to provide said output signals representative of said input measuring signals.

8. Measuring device according to claim 1 wherein said transmitter forms two different signals and comprising two optical transmission channels for transmitting a respective one of said two different signals from said transmitter to said receiver, and said receiver further including a second variable gain amplifier responsive to the transmission output from each of said two optical transmission channels, the gain of each said second variable gain amplifier being controlled to obtain compensation for parameter variations occurring simultaneously in said transmitter, receiver and two optical transmission channels.

9. Measuring device according to claim 8 wherein said receiver further includes means for summing the amplified output from each of said second variable gain amplifiers, means for comparing the summed output from said summing means with a second reference signal having a predetermined relationship to said reference signal for generating a control signal output, and regulator means responsive to said control signal output to vary the gain of each of said second variable gain amplifiers.

10. Measuring device according to claim 1 wherein said transmitter further includes feedback coupled amplifier means responsive to each of the at least two different signals for linearizing the operation of said transmitter.

11. Measuring device according to claim 2 wherein said receiver further includes light detection means responsive to each of said at least two different signals transmitted through said at least two optical transmission channels, and further comprising a light conductor interconnecting said receiver and transmitter and responsive to part of the light output from said light detection means to transmit a linearizing feedback signal to said means for transforming said electrical signals into optical signals, said receiver further including means responsive to the remaining portion of the light output from said detection means to generate said output signals.

12. Measuring device according to claim 1 further comprising power supply means for providing power to said transmitter and including means for generating light in response to an electrical stimulus, said transmitter including means responsive to light for generating an electrical power output, said power supply means further including light conducting means for transmitting light emitted from said light generating means to said electrical power output generating means.

13. Measuring device according to claim 2 wherein said receiver further includes a light detector responsive to each of said at least two different signals transmitted through said at least two optical transmission channels, said transmitter including means for generating electrical power in response to a light stimulus, and further comprising a light conductor for transmitting a portion of the light generated by said light detector to said electrical power generating means.

14. Measuring device according to claim 1 wherein said at least one variable gain amplifier has negative gain characteristics.

* * * * *